US008202930B2

United States Patent
Ganguli et al.

(10) Patent No.: US 8,202,930 B2
(45) Date of Patent: Jun. 19, 2012

(54) PTFE GRAPHITE COATING COMPOSITION, METHOD AND APPARATUS

(75) Inventors: Rahul Ganguli, Agoura Hills, CA (US); Ten-Luen T. Liao, S. Pasadena, CA (US); Roberto S. Santos, Hudson, MA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 0 days.

(21) Appl. No.: 13/109,915

(22) Filed: May 17, 2011

(65) Prior Publication Data

US 2011/0223324 A1    Sep. 15, 2011

Related U.S. Application Data

(62) Division of application No. 12/490,905, filed on Jun. 24, 2009, now Pat. No. 7,968,640.

(51) Int. Cl.
*C08K 3/04* (2006.01)
*B05D 1/12* (2006.01)
(52) U.S. Cl. ......................................... 524/495; 427/180
(58) Field of Classification Search ................... 524/495
See application file for complete search history.

(56) References Cited

U.S. PATENT DOCUMENTS 6,737,580 B2 * 5/2004 Eaton et al. ................... 174/388
* cited by examiner

*Primary Examiner* — Ling Choi
*Assistant Examiner* — Hui Chin
(74) *Attorney, Agent, or Firm* — Glenn H. Lenzen; Husch Blackwell LLP

(57) ABSTRACT

A non-stick coating application for high heat welding environments comprised of a fluorinated polymer combined with acidified graphite to which a hardening agent, such as alumina, may be added in some embodiments.

13 Claims, 3 Drawing Sheets

PTFE GRAPHITE COATING COMPOSITION, METHOD AND APPARATUS

CROSS REFERENCE TO RELATED APPLICATION

This application is a divisional of U.S. patent application Ser. No. 12/490,905, filed on Jun. 24, 2009, which is incorporated herein by reference in its entirety.

FIELD OF THE INVENTION

The invention relates to non-stick coatings. More particularly, the invention relates to non-stick coatings as applied to sensors used in high heat environments such as in welding applications where weld slag accumulates on the sensors causing them to fail. The preferred embodiments are directed towards a non-stick coating that rapidly disperses the heat and permits the weld slag to fall off the sensor, thereby increasing the longevity of the sensor.

BACKGROUND OF THE INVENTION

The use of non-stick coatings is well known in the art. While the prior art discloses a myriad of non-stick coatings and applications for the non-stick coatings, the composition of non-stick coatings varies and each variation brings different considerations, many of which are not useful in the field of high heat welding applications. Innovations for improved non-stick coatings are partly a result of the desire to have a coating that is easily applied, environmentally safe and more effective in prolonging the life of a sensor in a welding environment through increased heat dispersion and non-porosity.

Electromagnetic proximity sensors are employed in automobile assembly lines to detect the position of parts during welding operations conducted by robotic welders. As the sensors are proximate to the hot welding operation, slag from the welding process is splattered onto the sensors. Unless the slag falls off the sensor, the slag accumulates on the sensor and can eventually render the sensor inoperative. When the sensor becomes inoperable, the downtime from the delay needed to replace the sensor is expensive and includes the costs from delayed production as well as the costs associated with repair and replacement parts.

Solutions to the problem of weld slag exist in the art, such as alternate construction materials and specialized protective accessories. U.S. Pat. No. 6,617,845 by Shafiyan-Rad, et al., entitled "Proximity sensor resistant to environmental effects," claims a special housing for a proximity sensor that is made of a material with high thermal conductivity, such as copper or an alloy thereof. This device uses the inherent properties of the housing material to disperse heat and does not involve applying any coating.

Non-stick polytetrafluoroethylene (or PTFE) coatings, such as Teflon® (registered trademark of DuPont), are currently being used to reduce the impact of weld slag. However, over time the weld slag particles abrade the PTFE coatings and pits start to develop in the surface of the coating. This pitting or porosity is problematic in that even the smallest pits or pores provide a means by which weld slag can adhere to the coating. Over time, the weld slag accumulates until the sensor is rendered inoperable, requiring the replacement of the sensor. Even in the case of non-porous polyfluorocarbon based coatings, there are surface imperfections to which the weld slag attaches to form a layer that subsequently causes the sensor to stop functioning. The current state-of-the-art PTFE coatings fail after approximately 2500-3500 welding operations. U.S. Pat. No. 4,996,408 by Turck, et al., entitled "Proximity switch for use in welding facilities," claims a non-stick coating applied to proximity switches where the coating is polytetrafluoroethylene (or PTFE) with perfluoroalkoxy side chains. This application used PTFE as a non-stick coating but does not involve mixing the PTFE with any additional materials, other than coloring pigments, to form a special coating. Further, many coatings currently available tend to be non-aqueous based, which makes manufacturing them expensive since the manufacture has to be compliant with volatile organic carbon (VOC) emission standards.

SUMMARY OF THE INVENTION

A protective coating composition and application method for weld slag build up prevention are disclosed. The coating composition has a high thermal conductivity designed to disperse the heat from weld slag. It also has increased surface hardness to prevent damage to the coating and a non-porous surface which resists accumulation of weld slag. The composition does not incorporate any volatile organic compounds (VOCs) that present both flammability and environmental concerns.

One preferred embodiment is a composition comprised of a fluorinated polymer, such as Teflon® (or PTFE), and acidified graphite. Another preferred embodiment can include the addition of a hardening agent to the fluorinated polymer/acidified graphite composition, such as alumina, boron carbide or silicon carbide.

The composition is applied to a substrate, in the case of the preferred embodiment the housing structure of a sensor. The composition can be applied in a variety of ways including painting, spraying, powdering and dipping. The substrate, such as the sensor housing, is heated in a controlled environment to cure the coating, thus adhering the coating to the substrate. The temperature to which the substrate is heated depends on the substrate material. The current composition has a curing range that permits curing at a lower temperature than other applicable non-stick coatings currently in the art. This allows the coating to be applied to substrates comprised of materials having a relatively low melting point.

Test data show that the claimed composition as applied to a sensor lasts for over 15000 welding cycles, whereas the state of the art non-stick coating failed at around 3500 welding cycles. The present composition results in a service life of the sensor that is many times longer than the current state of the art.

Testing also shows that when using acidified graphite, the thermal conductivity of the resulting composition is four times greater than the thermal conductivity of a composition using only PTFE, a significant improvement over the prior art. The higher thermal conductivity results in increased dispersion of the high heat of the weld slag, which helps decrease the potential for damage to the surface coating and helps cool the weld slag so it falls off from the sensor.

The foregoing and other objects are intended to be illustrative of the invention and are not meant in a limiting sense. Many possible embodiments of the invention may be made and will be readily evident upon a study of the following specification and accompanying drawings comprising a part thereof. Various features and subcombinations of the invention may be employed without reference to other features and subcombinations. Other objects and advantages of this invention will become apparent from the following description.

DESCRIPTION OF THE DRAWINGS

Preferred embodiments of the invention, illustrative of the best modes in which the applicant has contemplated applying the principles, are set forth in the following description and are shown in the drawings and are particularly and distinctly pointed out and set forth in the appended claims.

DESCRIPTION OF THE PREFERRED EMBODIMENT

Figure 1:
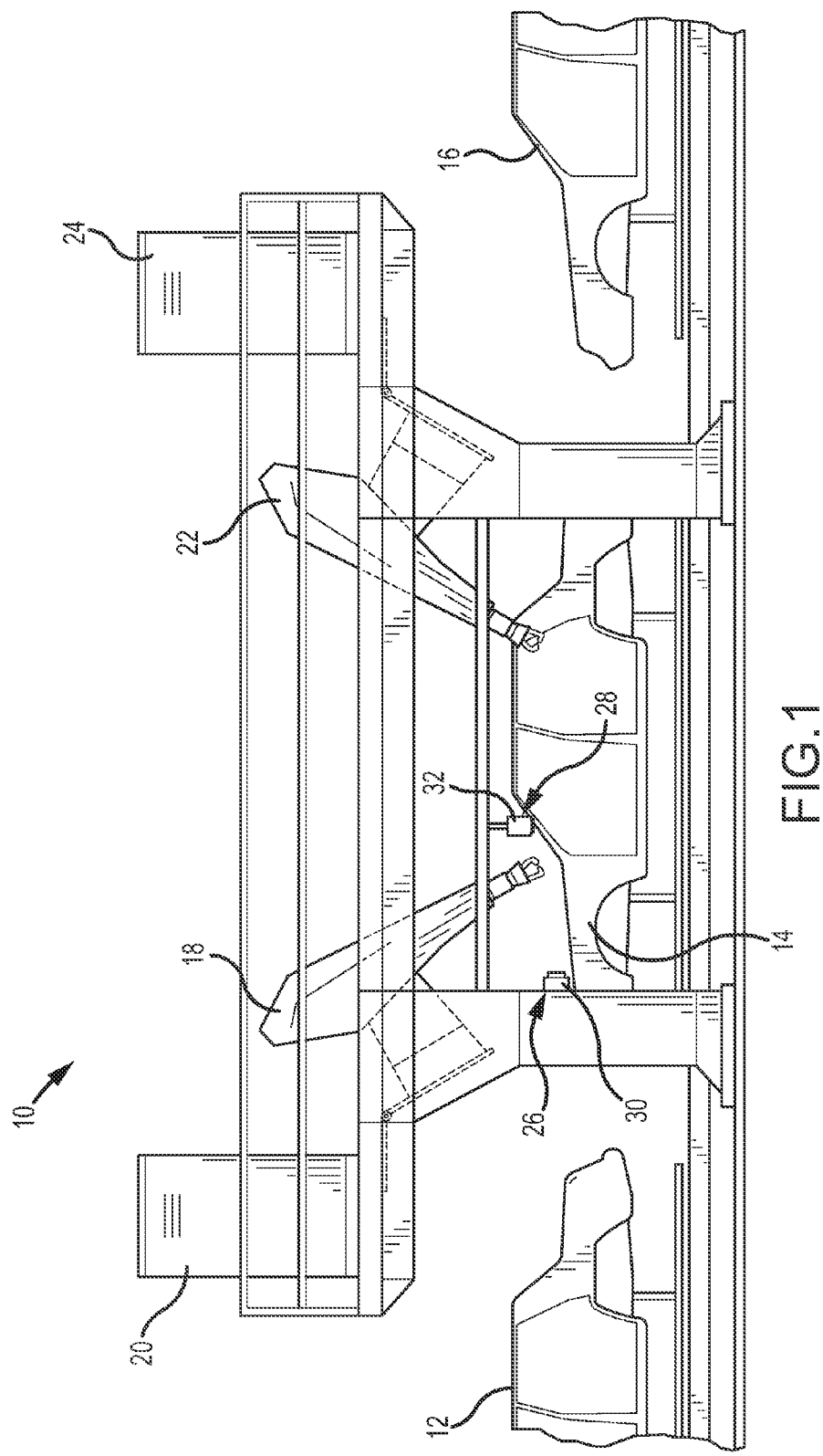
FIG. 1 is side elevation view of a segment of an automated welding line showing an embodiment of the sensor in position adjacent welding devices to register the position of the welding workpiece on the welding line.

As required, detailed descriptions of embodiments are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

One preferred embodiment of the composition comprises a fluorinated polymer, such as Teflon®, mixed with acidified graphite. The embodiments comprise a fluorinated polymer, such as fluorinated ethylene-propylene copolymer (or FEP), perfluoroalkoxy polymer resin (PFA), polyethylene tetrafluoroethylene (ETFE), polyvinylfluoride (PVF), polyethylene chlorotrifluoroethylene (ECTFE), polyvinylidene fluoride (PVDF), polychlorotrifluoroethylene (PCTFE), perfluoroelastimers (FFKM or FPM/FKM), and perfluoropolyether (PFPE). However, the preferred embodiment uses polytetrafluoroethylene (PTFE) which is most commonly known under the trade name Teflon®.

Pure Teflon® has been evaluated as possible coatings for shedding welding slag. Pure Teflon® coatings are not ideal in high heat welding environments as the surface of the coating tends to degrade over time thus making it more susceptible to retaining slag.

The preferred embodiments improve upon the current state of the art by incorporating a process whereby the graphite is acidified prior to mixing with the Teflon®. The acidification of the graphite creates a chemical structure such that the graphite binds to the Teflon® in such a way that leads to a more uniform coating and a harder coating than previously known in the art. This enables reduced mechanical damage to the coating in welding environments, thereby increasing the life of the coating. One preferred embodiment further improves upon the state of the art by including a hardening agent to the fluorinated polymer/acidified graphite to increase the overall hardness of the coating, allowing for fewer imperfections in the surface and less degradation of the surface over time. The hardening agents may be any ceramic particles known in the art to increase coating hardness. Specifically, they could include particles of silica, alumina, carbides of boron and silicon, nitrides of boron and silicon and any other similar particles known in the art.

The PTFE or Teflon®, or other fluorinated polymer, used in creating the composition is a water-based solution commercially available. The graphite used in the composition is commercially available, such as the high purity grade graphite powder from Nippon Graphite. The graphite powder is milled using any milling procedure available in the art. In a preferred embodiment, a SPEX SamplePrep Mixer/Mill® manufactured by of Metuchen was used. The graphite powder is sieved, in a preferred embodiment, using a 90 mesh size sieve. The graphite particles that pass through the sieve are collected. Following sieving of the graphite, the collected particles are then soaked in water to remove any hydrophobic particles. The graphite particles that are hydrophobic will float on the surface of the water and can be easily removed by skimming off the top layer of the water. The remaining particles are then collected and dried.

An acid mixture of one part nitric acid (90%) to three parts sulfuric acid (95-98%) is prepared and used to soak the graphite powder. Other acids and mixtures can be used so long as adequate edge functionalization of the graphite particles can be achieved. Edge functionalization of the graphite particles is the reaction of the carbon atoms at the edge of the graphite particles with the acid to create a large number of dangling bonds that further reacts with the polyfluorinated precursors to increase overall coating hardness. The graphite powder and the acid mixture are added together and the graphite powder is left to soak for at least one hour. After at least one hour, the graphite/acid solution is poured into a water bath. A Büchner funnel with a fritted disk is used to filter out the water/acid solution and to separate the acidified graphite. The acidified graphite remaining after filtering is in a wet powder form.

To form the preferred embodiment of the non-stick coating, water is added to the acidified graphite to make a 10-20% by weight graphite paste. The graphite paste is then slowly added to the commercially available water based PTFE (or Teflon®) with constant mixing to make the preferred composition.

Once the PTFE/acidified graphite composition is thoroughly mixed, a hardening factor can be added to the composition in order to create a harder cured surface. The hardening factor can be from commonly avaible ceramic oxide, carbide or nitride, such as alumina, silica, titania, zirconia, aluminum carbide, boron carbide, silicon carbide, tungsten carbide, aluminum nitride, boron nitride or silicon nitride.

One preferred embodiment composition has the following parameter ranges for each material used in the composition: PTFE (or Teflon®) in the range of 50 to 75% by weight; and acidified graphite in the range of 50 to 25% by weight. Another preferred embodiment composition has the following parameter ranges for each material used in the composition: PTFE (or Teflon®) in the range of 33% to 75% by weight; acidified graphite in the range of 15% to 50% by weight; and boron carbide in the range of 10% to 50% by weight. Another preferred embodiment is comprised of 50% PTFE, 25% acidified graphite and 25% boron carbide by weight.

In preparing one preferred embodiment of the composition, the following detailed measurements were observed. Fifteen (15) grams of graphite were collected following SPEX milling and sieving through a 90 micron mesh. A mixture of 125 milliliters of 90% nitric acid and 375 milliliters of 95-98% sulfuric acid was made, resulting in a total acid mixture of 500 milliliters. The fifteen (15) grams of graphite were added to 80 milliliters of acid mixture to create a suspension. After one hour, two (2) liters of water was added to the acid suspension and the resulting suspension was filtered through a Büchner funnel having a medium porosity glass frit. The wet acidified graphite removed from the funnel weighed thirty-five (35) grams and then was dried. After drying, water was then added back to make sixty-eight (68) grams of acidified graphite slurry. Eight (8) grams of acidified graphite slurry was slowly added to six (6) grams of 60%

PTFE resulting in fourteen (14) grams of the composition. In another preferred embodiment, six (6) grams of 60% PTFE aqueous solution and eight (8) grams of acidified graphite slurry were mixed together, and to which 1.8 grams of a hardening agent, such as alumina or boron carbide, was added resulting in 15.8 grams of the composition.

The method for applying the coating is described as follows. The resulting composition as described above can be reduced to either a liquid or a powder. The composition, if it is in a liquid form, can be applied to a substrate, such as the housing of a sensor, by dip coating, spray coating and brush coating, and if the composition is in powder form it can be powdered onto the substrate.

The substrate, or housing, is prepared prior to application of the composition. Preparation of the substrate typically involves roughening of the surface of the substrate, which is a well known procedure in the art, prior to applying surface coatings to help adherence of the coating to the substrate. The surface can be roughened by sandblasting if the substrate is a metal housing or by sandpaper if the substrate is a plastic housing. Once the surface is prepared, a single application of the composition by spraying, painting, dipping or powdering is then applied to the surface of the substrate.

Following application of the composition to the substrate, the substrate is then heated to 70° Celsius for 30 minutes and then heated at 350° Celsius for 10 minutes. The exposure to the heat cures the composition, resulting in a uniform, non-porous, non-stick coating on the surface of the substrate. The composition can be cured at any temperature between 200° and 400° Celsius, however, the coating can start to degrade at temperatures above 400° Celcius. An additional benefit derived from this composition is the cure temperature which is lower than that of pure Teflon®, allowing this composition to be applied to substrates having a lower melting point than previously permitted by using pure Teflon® coatings.

Once cured, the coating surface is smoothened using rollers, or using shot peening, both are processes known in the art to improve surface quality.

Referring now to FIG. 1 the use of a coated sensor embodiment in an automated welding line for automobiles 10 will be described. In FIG. 1 automobile part workpieces 12, 14, 16 are moved along welding line 10. As the workpieces advance along welding line 10, the workpieces are detected by sensors 26, 28 as the workpieces come into proximity of sensors 26, 28. As previously mentioned, sensors 26, 28 are electromagnetic sensors that detect the presence of the workpieces 12, 14, 16 as the metal of the workpieces are moved into a position adjacent to sensors 26, 28. Applied to the exterior housing 30, 32 of sensors 26, 28 is the coating previously described herein. It will be appreciated by those skilled in the art that, as previously described, how welding line 10, generally operates when provided with electromagnetic proximity sensors 26, 28 for detecting the position of the workpieces 12, 14, 16 along the welding line 10 that are to be welded by robotic welders 18, 22. The robotic welders are operated by welding controllers 20, 24. As the workpieces 12, 14, 16 approach sensors 26, 28, electromagnetic proximity sensors detect workpieces 12, 14, 16 and transmit data to welding controllers 20, 24. Welding controllers 20, 24 adjust the advancement of welding line 10 to permit welding devices 18, 22 to be moved into position to generate a weld at a predetermined position on workpieces 12, 14, 16. It will be appreciated that sensors 26, 28 often will be near the site of activity of welding devices 18, 22 and that the housing 30, 32 of sensors 26, 28 may be exposed to hot weld slag being splattered onto the sensor housing during the use of welding devices 18, 22. The previously described coating may be applied to housing 30, 32 of sensors 26, 28 to protect the sensors from the build up of hot weld slag on the sensor housing 30, 32 by enabling the sensor housing 30, 32 to dissipate the heat from the weld slag and by providing a smooth and hard surface to the sensor housing 30, 32 that allows the sensor housing to shed weld slag in an improved manner. As previously described in greater detail above, the coating on the sensor housing 30, 32 may be comprised of a mixture of a fluorinated polymer, acidified graphite and may comprise a hardening agent. The mixture may be cured at a temperature of between 200°-400° Celsius after being applied to the housing. The coating provides a surface on said housing 30, 32 exterior that improves the shedding of hot weld slag splattered onto said housing 30, 32 during the operation of welding device 18, 22.

Figure 2:
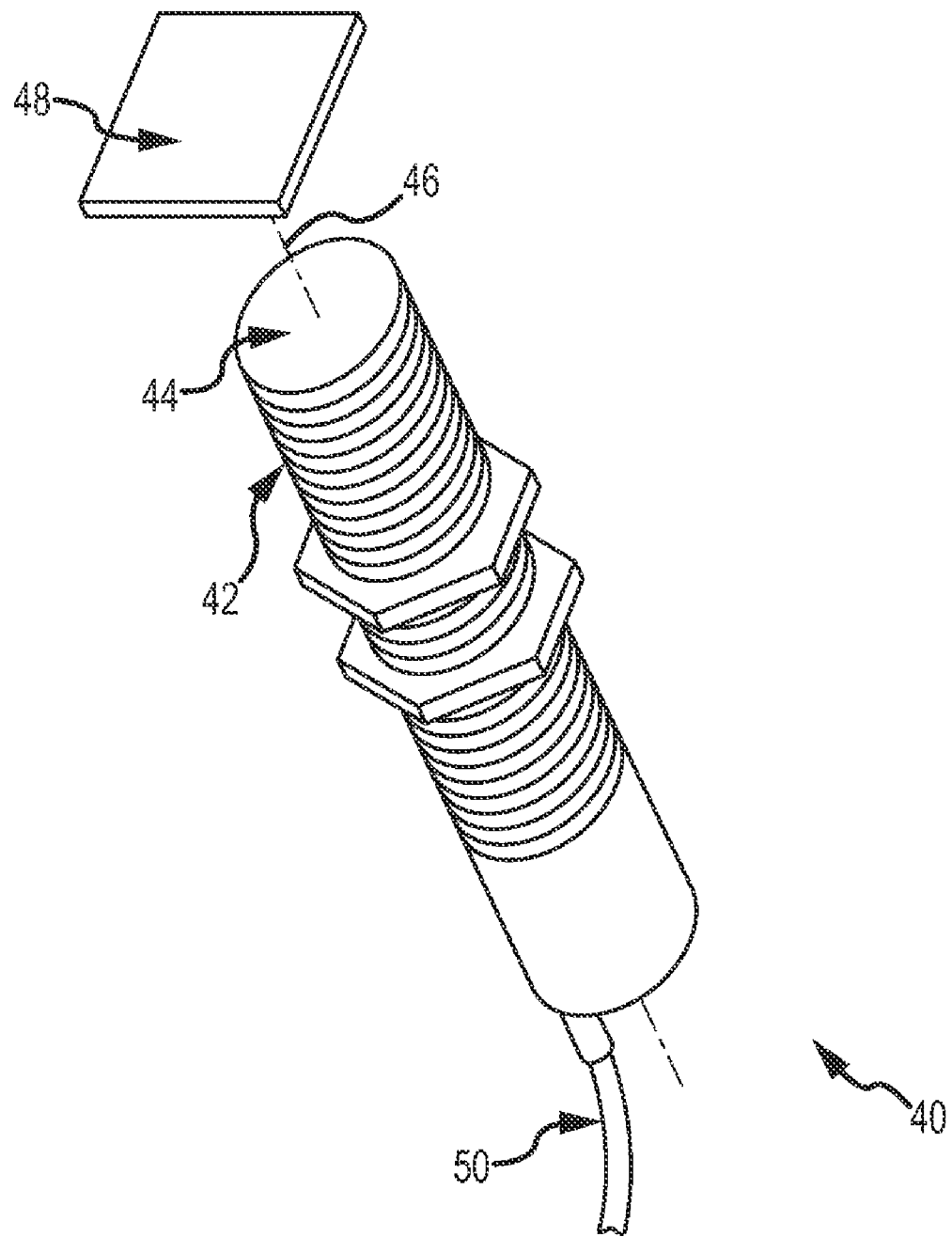
FIG. 2 is a perspective view of an industrial control, such as an inductive proximity sensor, according to at least one embodiment.

FIG. 2 shows an example of an industrial control, such as a proximity sensor 40 for sensing one or more objects 48, that can be coated in any of the various surface coating compositions presented. The proximity sensor 40 has an elongate cylindrical housing 42. The housing 42 can have a variety of shapes. For instance, the housing 42 can have a rectangular prism shape, cube shape, or other shapes. The housing 42 is partly defined by a longitudinal axis 46. A sensing face 44 is located at one end of the housing 42 to permit the associated circuitry that is located within the housing 42 to perform a proximity sensing function through the sensing face 44 as is known in the art. The sensing face 44 may be formed as an integral part of the housing 42 or may be a separate piece which is then attached to the housing 42 as is known in the art. The sensing face 44 may be made of a metal, thermosetting plastic or resin material, or other material known in the art. A connection means 50, such as a cable or other connection means known in the art, is located opposite the sensing face 44. In accordance with the present invention, the external surfaces of both the housing 42 and sensing face 44 are coated with a non-stick material that rapidly disperses heat and permits weld slag to fall off of the sensor.

Figure 3:
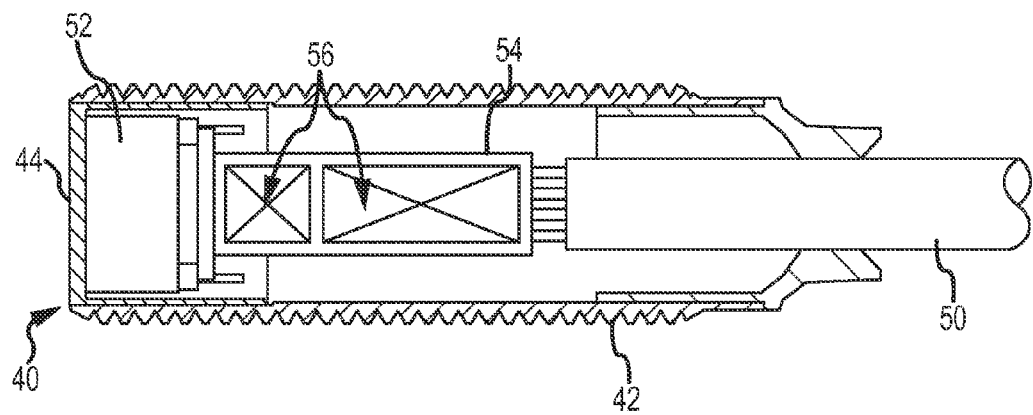
FIG. 3 is a cross-sectional view of an inductive proximity sensor such as the sensor shown in FIG. 2.
Figure 4:
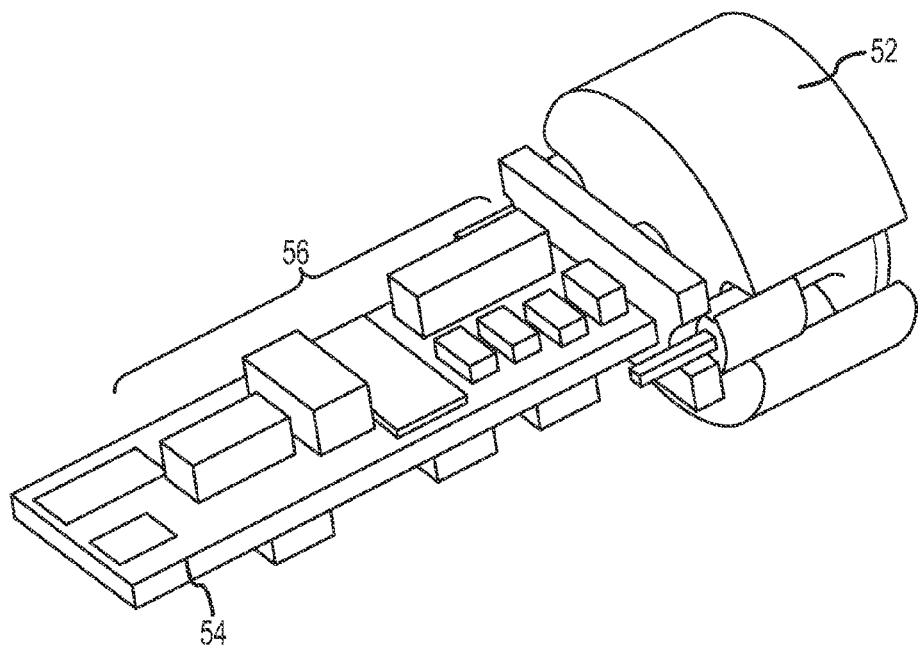
FIG. 4 is a perspective view of an inner portion of the inductive proximity sensor shown in FIG. 3.

Referring to FIGS. 3 and 4, the proximity sensor 40 includes internal electronics, such as sensing circuitry, such as that for an inductive type of proximity sensor. The printed circuit board 54, with circuitry components 56 mounted thereon, is coupled to a coil assembly 52 which is disposed within the housing 42 at a location adjacent to the sensing face 44. The connection means 50 is located opposite the sensing face 44 for providing power and communicating an output signal.

In the foregoing description, certain terms have been used for brevity, clearness and understanding; but no unnecessary limitations are to be implied therefrom beyond the requirements of the prior art, because such terms are used for descriptive purposes and are intended to be broadly construed. Moreover, the description and illustration of the invention is by way of example, and the scope of the invention is not limited to the exact details shown or described.

Certain changes may be made in embodying the above invention, and in the construction thereof, without departing from the spirit and scope of the invention. It is intended that all matter contained in the above description, and shown in the accompanying drawings, shall be interpreted as illustrative and not meant in a limiting sense. Having now described the features, discoveries and principles of the invention, the manner in which the inventive composition and method constructed and used, the characteristics of the construction, and advantageous, new and useful results obtained; the new and useful structures, devices, elements, arrangements, parts and combinations, are set forth in the appended claims. It is also to be understood that the following claims are intended to cover all of the generic and specific features of the invention herein described, and all statements of the scope of the invention which, as a matter of language, might be said to fall therebetween.

Having thus described the invention what is claimed as new and desired to be secured by Letters Patent is as follows:

1. A method of forming a non-stick coating comprising the steps of:
   providing a substrate to be coated,
   preparing the substrate for coating by cleaning and roughening the surface,
   providing a coating material comprising a fluorinated polymer, acidified graphite and a hardening agent,
   applying said coating to said surface,
   subjecting said substrate or apparatus to heat to cure said coating.

2. The method of claim 1, wherein said coating is smoothened through a rolling process after said coating has been cured.

3. The method of claim 1, wherein said coating is smoothened through a shot peening process after said coating has been cured.

4. The method of claim 1, wherein said coating is a mixture of a fluorinated polymer and acidified graphite.

5. The method of claim 1, wherein said surface is cleaned by degreasing, detergent scrubbing, detergent soaking or sand blasting.

6. The method of claim 1, wherein said surface is roughened by sand blasting or sanding by sand paper.

7. The method of claim 1, wherein the application of said coating is by spraying, painting, dipping or powdering.

8. The method of claim 1, wherein the curing of said coating comprises heating said substrate to between 200 degrees and 400 degrees Celsius.

9. The method of claim 1, wherein the hardening agent is an oxide, carbide or nitride.

10. The method of claim 1, wherein the hardening agent is alumina, silica, titania, zirconia, aluminum carbide, boron carbide, silicon carbide, tungsten carbide, boron nitride, aluminum nitride or silicon nitride comprising between 10 percent and 50 percent by weight of said coating.

11. The method of claim 1, wherein the fluorinated polymer is between 33 percent and 75 percent by weight of said coating.

12. The method of claim 1, wherein the acidified graphite is between 15 percent and 50 percent by weight of said coating.

13. The method of claim 1, wherein the fluorinated polymer is selected from the group consisting of polytetrafluoroethylene, fluorinated ethylene-propylene copolymer, perfluoroalkoxy polymer resin, polyethylene tetrafluoroethylene, polyvinylfluoride, polyethylene chlorotrifluoroethylene, polyvinylidene fluoride, polychlorotrifluoroethylene, perfluoroelastomers, and perfluoropolyether.

* * * * *